United States Patent
Kounavis

(10) Patent No.: US 7,707,483 B2
(45) Date of Patent: *Apr. 27, 2010

(54) TECHNIQUE FOR PERFORMING CYCLIC REDUNDANCY CODE ERROR DETECTION

(75) Inventor: Michael Kounavis, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 676 days.

This patent is subject to a terminal disclaimer.

(21) Appl. No.: 11/137,964

(22) Filed: May 25, 2005

(65) Prior Publication Data

US 2006/0282744 A1 Dec. 14, 2006

(51) Int. Cl.
*H03M 13/00* (2006.01)

(52) U.S. Cl. ........................ 714/781; 714/758

(58) Field of Classification Search ................. 714/774, 714/779, 781, 758
See application file for complete search history.

(56) References Cited

U.S. PATENT DOCUMENTS

| | | | | |
|---|---|---|---|---|
| 3,678,469 A | * | 7/1972 | Freeman et al. | 714/779 |
| 3,859,630 A | * | 1/1975 | Bennett | 714/757 |
| 4,677,623 A | * | 6/1987 | Iwasaki et al. | 714/762 |
| 5,381,423 A | * | 1/1995 | Turco | 714/762 |
| 5,727,003 A | * | 3/1998 | Zook | 714/762 |
| 6,836,869 B1 | * | 12/2004 | Wyland | 714/781 |
| 7,103,822 B2 | * | 9/2006 | Glaise et al. | 714/758 |

FOREIGN PATENT DOCUMENTS

| | | |
|---|---|---|
| CN | 101185245 | 5/2008 |
| WO | 03071688 A2 | 8/2003 |
| WO | WO 03/071688 | 8/2003 |
| WO | 20060128134 | 11/2006 |

OTHER PUBLICATIONS

Office Action received for European Patent Application No. 06771534.2 -2223, mailed on May 8, 2008, 3 pages.
International Search Report and written opinion received for PCT Application No. PCT/US2006/020830, mailed on Aug. 21, 2007, 13 pages.
Office Action received for Korean Patent Application No. 2007-7027314, mailed on Feb. 26, 2009, 4 pages of English translation.
International Preliminary Report on Patentability received for PCT Application No. PCT/US2006/020830, mailed on Dec. 13, 2007, 10 pages.

* cited by examiner

*Primary Examiner*—M. Mujtaba K Chaudry
(74) *Attorney, Agent, or Firm*—Caven & Aghevli LLC

(57) ABSTRACT

A technique to perform carry-less multiplication and bit reflection operations. More specifically, embodiments of the invention include a technique to perform cyclic redundancy code (CRC) generation.

26 Claims, 5 Drawing Sheets

TECHNIQUE FOR PERFORMING CYCLIC REDUNDANCY CODE ERROR DETECTION

FIELD OF INVENTION

Embodiments of the invention described herein relate to data transmission integrity. More particularly, embodiments of the invention relate to techniques that may be used to perform various functions involved in data error detection algorithms, such as those using cyclic redundancy codes (CRC).

BACKGROUND

Cyclic redundancy codes (CRC) have been used in various algorithms to ensure the integrity of data transmitted from a transmitting device or system to a receiving device or system. In general, CRC error detection is accomplished by encoding with transmitted data, a code representative of the remainder of an arithmetic carry-less division operation (i.e., modulo-2) between the transmitted code and a generator polynomial. The same generator polynomial may then be used at the receiver in another carry-less division operation on the transmitted data, the result of which can be compared to the remainder value encoded to detect any errors in the transmitted data.

One prior art technique for performing CRC error detection includes "table-based" algorithms, which replace one or more arithmetic operations involved in the carry-less division operations with a look-up operation within a table containing pre-calculated results of the one or more arithmetic operations. FIG. 1, for example, illustrates a prior art table-based CRC error detection algorithm, in which a 32 byte register contains the current value of the CRC code associated with a bit stream. The value stored within this register represents an increase of the data to be transmitted. Data may be augmented with the CRC code before transmission. When a new byte from the non-augmented portion of the data is used in the calculation of CRC, a Boolean "exclusive OR" (XOR) operation is performed between the new byte and the least significant byte of the register containing the current CRC value. The result of the XOR operation is used to index a table of 256 entries (4 bytes per entry, for example), which contain a pre-calculated result of a carry-less (e.g., modulo-2) division operation between the table index multiplied by the value, $2^{32}$, and the generator polynomial. The bytes returned from this table lookup operation are then XOR-ed with the remaining bytes of the register holding the current CRC value which have not been taken into account (i.e., the 3 most significant bytes of the register). These bytes are shifted to the right by one byte position before the XOR operation takes place. The result of this XOR operation is the next CRC value to be used for augmenting the data and is kept in the same register as the old CRC value.

The operations discussed in regard to FIG. 1 require processing resources (e.g., cycle time and power) to compute, as well as numerous input/output and/or memory access operations within the computer systems in which the CRC algorithm is implemented. Further complicating the problem is the fact that many systems implementing CRC algorithms use bit reflection techniques within the transmitted data portions. More specifically, some CRC generation algorithms (e.g., "CRC32c") reflect the bits inside their respective bytes before CRC code calculation. Bit reflection is a process by which the bits of a binary data segment, such as a byte or a collection of bytes, switch positions in a mirrored fashion. For example, the reflected representation of "1010" is "0101". Typically, a combination of bit reflection and the use of a specific addressing scheme in a processor (e.g., "little endian") result in the bits of an input stream being stored in a order which is suitable for fast processing by a software CRC generation algorithm.

Dealing with the reflected version of data introduces yet another layer of complexity and computational intensity to the prior art CRC algorithm illustrated in FIG. 1. In general, many prior art CRC algorithms, particularly those using table-based implementations, can require excessive hardware and/or software resources, as well as an increase of power required from the systems in which the algorithms are implemented.

BRIEF DESCRIPTION OF THE DRAWINGS

Claimed subject matter is particularly and distinctly pointed out in the concluding portion of the specification. The claimed subject matter, however, both as to organization and method of operation, together with objects, features, and advantages thereof, may best be understood by reference to the following detailed description when read with the accompanying drawings in which:

DETAILED DESCRIPTION

Figure 1:
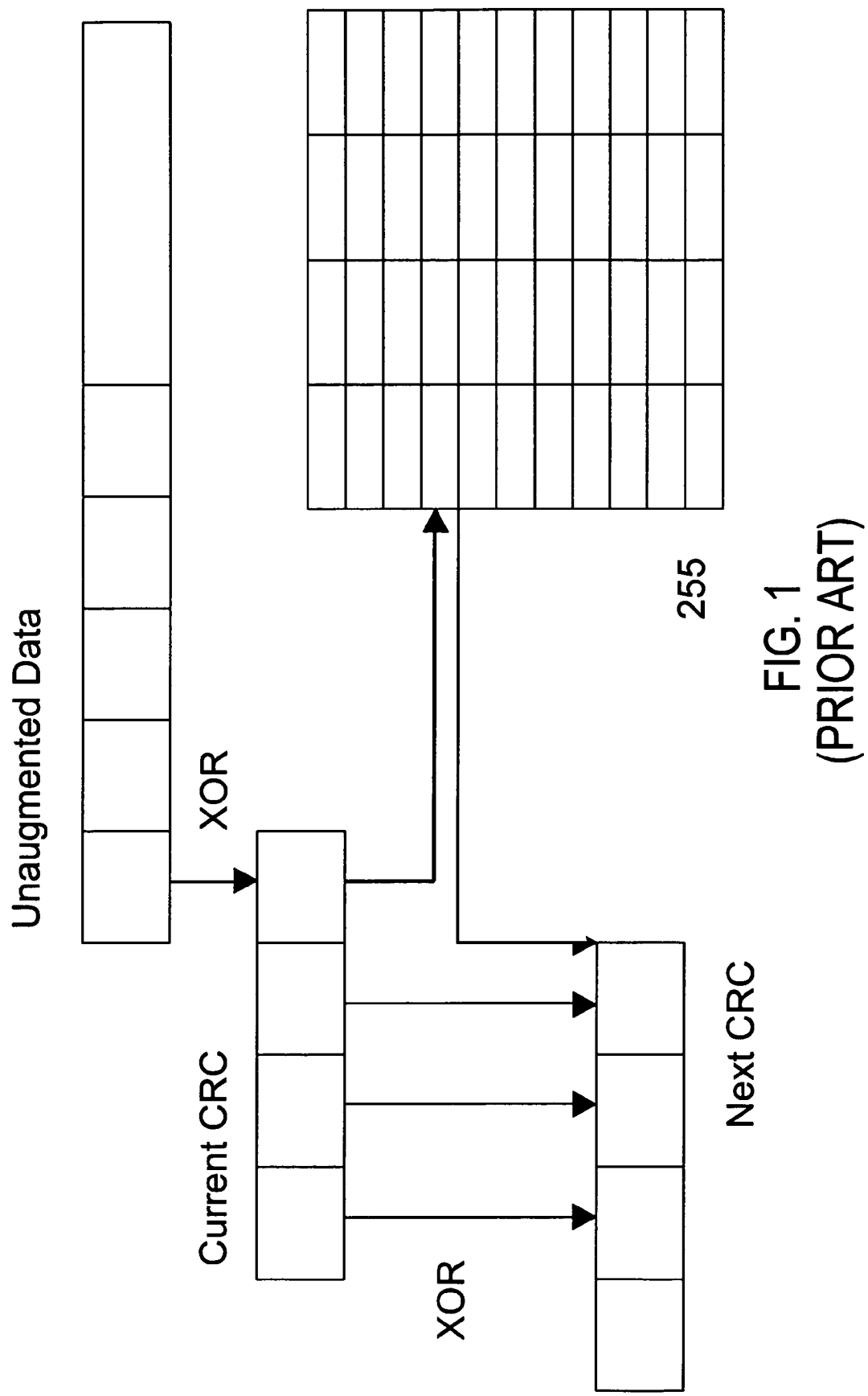
FIG. 1 illustrates a prior art implementation of cyclic redundancy code (CRC) generation.

In the following detailed description, numerous specific details are set forth in order to provide a thorough understanding of the claimed subject matter. However, it will be understood by those skilled in the art that the claimed subject matter may be practiced without these specific details. In other instances, well-known methods, procedures, components and circuits have not been described in detail so as not to obscure the claimed subject matter.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

At least one embodiment of the invention improves upon prior art cyclic redundancy codes (CRC) error detection implementations through the use of two new microprocessor instructions that may be used to carry out certain aspects of CRC generation algorithms, or other computational algorithms performed by a computer. Throughout this disclosure the use of the term "instruction" shall mean any machine-readable construct, that may be represented by "bits", that when performed by a machine causes the machine to perform various operations commensurate with the instruction. In one embodiment, for example, an instruction may be a computer-readable instruction, which when executed by a processor causes the processor to perform an operation or set of operations that are either indicated by the instruction or are otherwise consistent with the purpose of the instruction. Particularly, in one embodiment, an instruction may be a group of bits, or representation thereof, stored in some medium, such as a diskette, semiconductor memory device, hard drive, compact disc, or the like. In relation to microprocessor architecture, the use of the term "instruction" may mean a user-visible "macro-instruction", such as an instruction within a particular instruction set architecture (ISA), or a "micro-instruction" derived or decoded from a macro-instruction according to an ISA.

Instead of relying on a table-based CRC error detection algorithm, as in the prior art, at least one embodiment of the invention includes two new instructions: One for performing carry-less (e.g., modulo-2) multiplication and another instruction for performing bit reflection on a segment of data in which errors are to be detected. In other embodiments, these two instructions may be combined into one instruction, whereas in other embodiments, these two instructions may be sub-divided into other instructions that perform certain tasks consistent with the instructions.

Furthermore, in one embodiment of the invention, the carry-less division of a data segment by a polynomial generator ("generator") is performed by an instruction (e.g., "carry-less multiplication, or "CMUL", instruction) that multiplies the modulo-2 arithmetic reciprocal of the generator with the data segment. The term 'modulo-2 arithmetic reciprocal' in this disclosure is used to indicate a quotient resulting from a modulo-2 division of an exponential value of base 2 and a generator polynomial, wherein the exponent of the exponential value of base 2 is equal to the sum of the degree of the generator polynomial and the length of an input data slice. In yet another embodiment of the invention, the input data slice, which is multiplied with the reciprocal of the generator polynomial, is reflected. Accordingly, in such an embodiment, the number of processing cycles necessary to perform the carry-less division can be reduced in relation to some prior art CRC algorithm implementations, such as those using table-based CRC error detection implementations. This may be true, in some embodiments, because a user-level software program may only be able to issue a relatively small number of instructions when generating the CRC (e.g., four instructions in some applications) to be encoded with the data segment rather than performing many more operations, such as shift operations, exclusive-OR (XOR) Boolean operations, and table look-up operations. In some embodiments, the instructions proposed as part of this invention replace all of these exemplary prior art operations, whereas in other embodiments the instruction may only replace a subset of these operations. In either case, embodiments of the inventions may improve CRC error detection performance over some part of prior art implementations.

In one embodiment of the invention, bit reflection is performed on a data segment upon which CRC error detection is to be performed. In other embodiments, bit reflection may not be necessary and the CRC may be generated and encoded with its corresponding data segment without performing bit reflection. In yet another embodiment of the invention bit reflection may be performed on the initial value of the CRC. In one embodiment of the invention, in which bit reflection is performed, bit reflection may be performed prior to the generation of a CRC. In other embodiments bit reflection may be performed after the generation of the CRC. For example, in one embodiment, a bit reflection ("BREF") instruction may be performed prior to performing a carry-less multiply (CMUL) instruction.

The data segment upon which CRC error detection is to be performed may be any size, depending on what's appropriate in a particular application. For the purposes of this disclosure, data slice input size (in numbers of bits) will be referred to as "s", and the greatest power ("degree") in a generator polynomial will be referred to as "t". Examples will be illustrated using 32 bit and 64 bit data segments ("slices"). However, it should be understood that embodiments of the invention are not limited to 32 bit and 64 bit slices, but may include bit slices greater than or less than 32 and 64 bits.

CRCs can be generated by calculating the remainder of a carry-less arithmetic division operation, in which the dividend is a data stream or portion of a data stream ("data slice"), in which errors are to be detected and the divisor is a generator polynomial. This remainder can then be encoded into another data stream and transmitted from a transmitting device or system to a receiving device or system. The same operation may be performed at a receiver to verify the integrity of the data stream or data slice ("data stream" and "data slice" may be referred to interchangeably for the purpose of this disclosure).

In general, CRCs may by calculated in one embodiment by performing the following operations: Selecting an initial CRC value, which may be application-dependent, performing an exclusive "OR" Boolean (XOR) operation between the initial CRC value and a portion of a, or an entire, data slice (reflected or un-reflected) upon which the CRC error detection is to be performed, updating the CRC value from its current state to a next state until no other data slices are to be encoded or decoded with a corresponding CRC. In one embodiment, the CRC value may be updated according to operations and calculations described below.

In one embodiment, a remainder value may be generated according to the equation:

$$r = S \times 2^{t+s} \bmod g$$

In the above equation, "r" represents a number (represented by "t" number of bits) equal to the remainder of a carry-less division operation, "S" is a number (represented by "s" number of bits) equal to the value of a data slice upon which a CRC error detection operation is to be performed. S may also be equal to a value represented by a set of s most-significant bits of a dividend, represented by a value equal to S multiplied by $2^{t+s}$, not having all zero values. Also in the above equation, "g" is a number (represented by "t+1" number of bits) that represents a generator polynomial. In general, g will be represented with one bit more than r throughout the description of embodiments of the invention described herein. In the above equation, the data slice, S, is multiplied by a constant, 2 to a power equal to the sum of t and s, the result of which is divided, using modulo-2 division, by the generator, g.

It can be shown that the above equation is equivalent to the following equation, in which the remainder from the above equation is calculated from a carry-less multiplication operation performed between the data slice and the reciprocal of the polynomial generator:

$$r_{s\,Bit\,Slice} = L_t(g^* \times M_s(S \times q^+))$$

In the above equation, the remainder, r, can be calculated from the t least significant bits (denoted by "$L_t$" in the equation) of the modulo-2 arithmetic product of the t least significant bits of generator, g, (denoted by "$g^*$" in the equation) and the s most significant bits (denoted by "$M_s$" in the equation) of the modulo-2 arithmetic product of the data slice, S, and the "s+1"-bit quotient, $q^+$, of the modulo-2 arithmetic division of constant, $2^{t+s}$, by the generator, g. The above equation may be applied to any number of data slices. For example, if the data slice, S, is 32 bits, the remainder can calculated from the following equation:

$$r_{32\,Bit\,Slice} = 32_t(g^* \times 32_m(S \times q^+))$$

In the above equation, "$32_m$" denotes the 32 most significant bits of the modulo-2 arithmetic product of S and $q^+$, where $q^+$ is 33 bits long (data slice length plus one bit) and represents modulo-2 arithmetic quotient of a division of constant, $2^{64}$, by generator, g. In another embodiment, in which the data slice, S, is 64 bits in length, the remainder, r, may be calculated from the following equation:

$$r_{64\,Bit\,Slice} = 32_l(g^* \times 64_m(S \times q^+))$$

In this equation, "$64_m$" denotes the 64 most significant bits of the modulo-2 arithmetic product of S and $q^+$, where $q^+$ is 65 bits long (data slice length plus one bit) and represents modulo-2 arithmetic quotient of a division of constant, $2^{96}$, by generator, g.

Similarly, a remainder corresponding to an 8 bit data slice, s, can be calculated from the following equation:

$$r_{8\,Bit\,Slice} = 32_l(g^* \times 8_m(S \times q^+))$$

Figure 2:
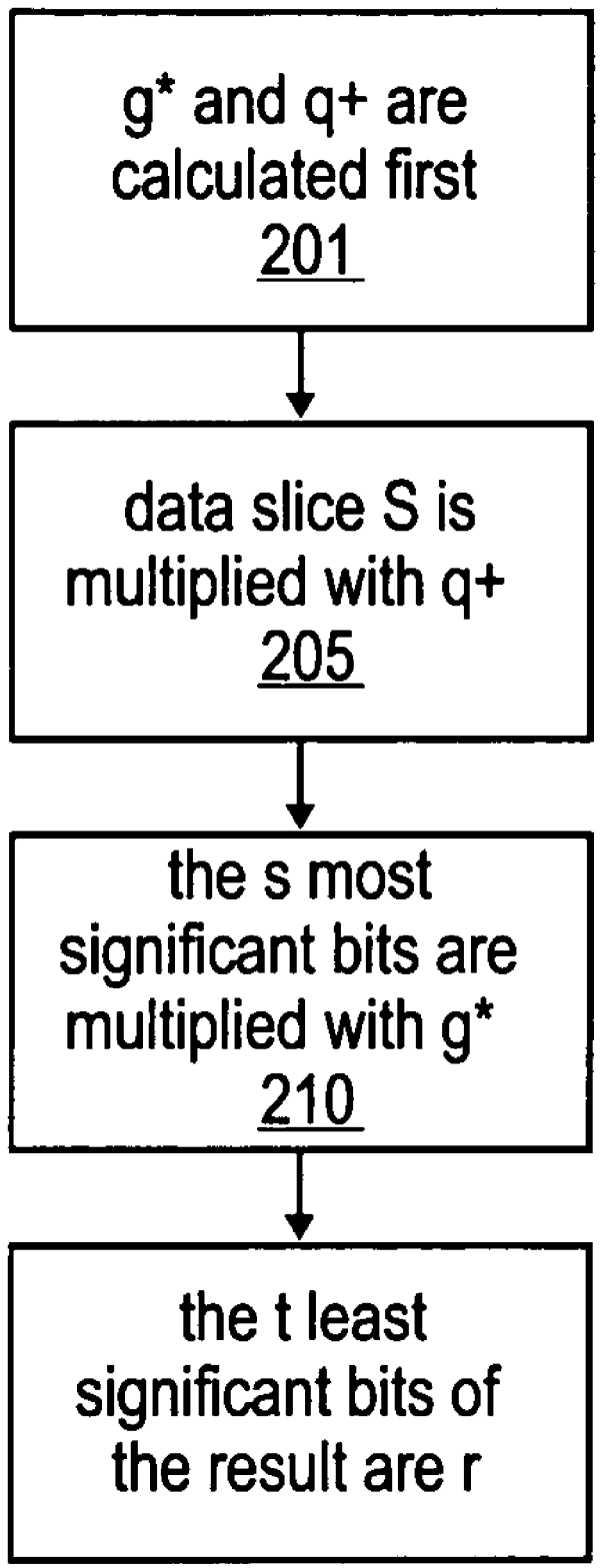
FIG. 2 is a flow diagram illustrating operations used in carrying out at least one embodiment of the invention.

In this equation, "$8_m$" denotes the 8 most significant bits of the modulo-2 arithmetic product of s and $q^+$, where $q^+$ is 33 bits long (data slice length plus one bit) and represents modulo-2 arithmetic quotient of a division of constant, $2^{64}$, by generator, g. Various operations, in various orders, can be performed to implement the above equations in embodiments of the invention. FIG. 2 is a flow diagram illustrating operations involved in the processing of a carry-less multiplication instruction according to one embodiment of the invention.

Referring to FIG. 2, $g^*$ and $q^+$ are calculated at operation 201. As discussed above, $g^*$ represents the t least significant bits of generator, g, whereas $q^+$ represents the s+1-bit modulo-2 arithmetic quotient of a division of a constant, $2^{t+s}$, by generator, g. The number $q^+$ may be conceptualized as the modulo-2 arithmetic reciprocal of the generator polynomial. At operation 205, data slice, S, is multiplied with $q^+$. Operation 205 results in a number twice the bit size of s, the s most significant bits of which are multiplied with $g^*$ at operation 210. Operation 210 results in a "t+s-1"-bit number, the t least significant bits of which are the desired remainder, r.

Advantageously, remainder, r, resulting from the above-described carry-less multiplication instruction can be performed using a series of Boolean XOR operations, just as in the case of a carry-less division operation. Therefore, in one embodiment, the operations illustrated in FIG. 2 to carry out the above equations can be reduced to a series of XOR and bit shifting operations. This is because carry-less multiplication, as the name implies, does not factor in the bit that's carried as a result of each multiplication operation among two operands having a number of bits. For example, in a multiplication operation involving operands of 2 bits each, such as 11×11, where both operands are represented by binary values, the result would be 1001 (binary). However, in a carry-less multiplication of the same operands, the result would be 101, which may be derived by XOR-ing shifted versions of the operands. This helpful property of carry-less multiplication allows at least one embodiment of the invention to calculate the CRC relatively quickly. Furthermore, because, in one embodiment, the carry-less multiplication is performed by an instruction designed to be executed by processing hardware or software, a user software does not have to perform the shift and XOR operations involved in one embodiment of the invention. Instead, these operations can be handled by the processing hardware or software.

Figure 3:
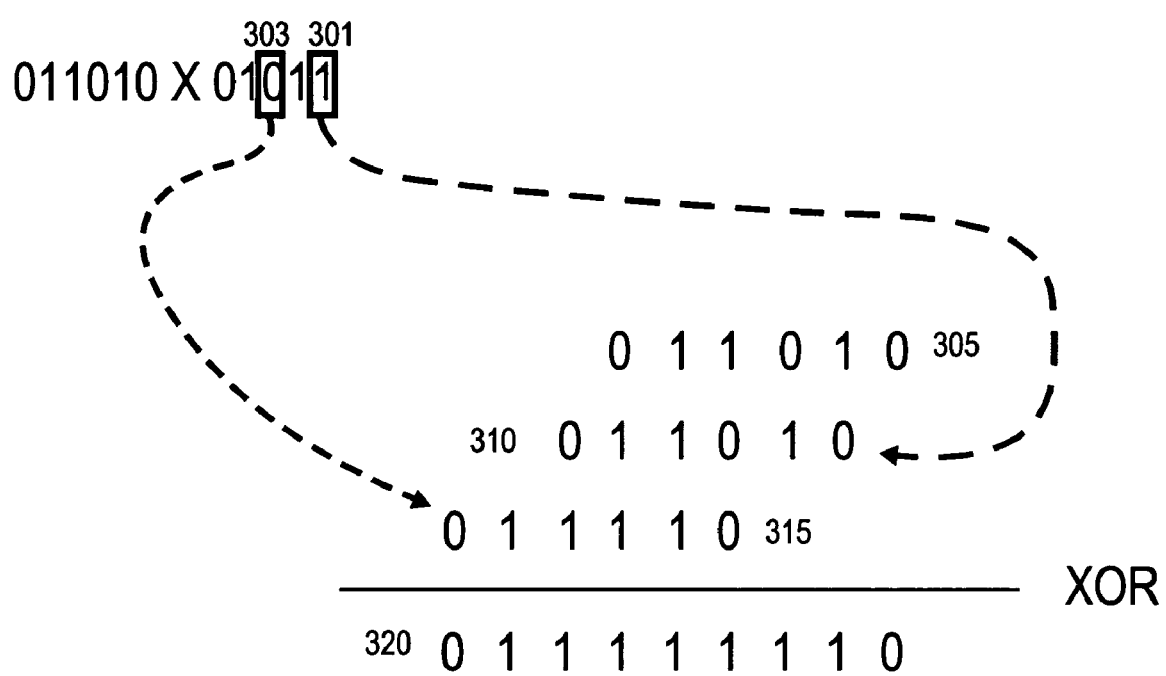
FIG. 3 illustrates various operations involved in carry-less multiplying a binary data slice, according to one embodiment of the invention.

To further illustrate carry-less multiplication according to one embodiment of the invention, FIG. 3 illustrates various operations involved in carry-less multiplying a binary data slice, 11010, and a modulo-2 arithmetic reciprocal of a generator, 011010. First, the data slice is bit reflected to produce the reflected data slice, 01011. In one embodiment, the bit reflection results from performing a bit reflection instruction, such as the BREF instruction discussed above and described in further detail below. In other embodiments, the data slice may not be bit reflected. Next, all bits of the reflected data slice, except the least significant bit, are examined (right to left) to determine whether they are "1" s or "0" s. Due the nature of binary carry-less multiplication, only a number of XOR and left-shift operations equal to the number of 1's in the most significant bits (i.e., all bits except the least-significant bit) of the data slice need be performed to generate the CRC.

In examining the data slice from right to left, in FIG. 3, the first non-least significant bit position containing a "1" value is bit position one 301. Accordingly, a left-shifted version of the modulo-2 arithmetic reciprocal of a generator, 011010 310, is XOR-ed with the non-shifted version of the modulo-2 arithmetic reciprocal of a generator, 011010 305. The next bit position in the data slice going from right to left containing a "1" value, is bit position three 303. Accordingly, a left-shifted version 315 of the reciprocal of a generator 310 is XOR-ed with the reciprocal of a generator 310, the result 320 of which is the desired result.

The CRC error detection algorithm of the embodiment discussed above with reference to FIGS. 2 and 3, can be implemented in one embodiment using two new instructions that are designed to be executed by a processor or number of processors according to any given ISA. Although in some embodiments, the operation of the instructions may depend on the particular ISA in which they are used, the functionality of the instructions may be applied across any ISA.

In one embodiment a bit reflection instruction ("BREF") is used to perform a bit swap functionality, whereby a bit at position "i" is swapped with a bit at position "l–i–1", and vice versa, where "l" is a register length and i may range from 0 to l–1. In a particular processing hardware implementation, the BREF instruction may work in the following fashion:

DEST<–BREF(DEST)

In the above operation, the BREF instruction performs a bit reflection operation on the contents of a register or other storage structure, "DEST", and places the result in DEST. In other embodiments, the BREF instruction may operate on the contents of a register or other storage structure besides DEST. Regardless of the specific hardware implementation, the BREF instruction functions to return a bit-reflected value.

In one embodiment, a carry-less multiplication instruction ("CMUL") operates on either the bit reflected version of a value or the original value to produce a CRC that can be encoded with the value, or some modified version thereof. Furthermore, a CMUL instruction may correspond to various lengths of data slices, such as a 32 bit data slice and a 64 bit data slice. Depending upon micro architecture of the processing resources to execute the instruction, one or more registers or other storage structures may be used to store the operands and/or results of the CMUL instruction. For example, in one embodiment a 32 bit CMUL instruction may perform the following operation:

[EDX:EAX]<–CMUL(EAX)

In the above operation, CMUL performs a carry-less multiply operation on a source operand and an operand stored in a 32 bit register or other storage structure, "EAX", and places the 64 bit result in 32 bit storage structures, such as general purpose registers, "EDX" and EAX. In other embodiments, CMUL may operate on operands stored in another structure besides EAX. Similarly, CMUL may operate on two operands stored in a 64 bit register or other storage structure by either operating on a source operand and an operand stored in two 32 bit storage structures or one 64 bit storage structure and storing the 128 bit result within two 64 bit registers or other storage structures.

In one embodiment, the above operations supported by instructions, BREF and CMUL, are implemented in hardware logic within a semiconductor device, such as a microprocessor. In other embodiments, the above operations may be supported by instructions, BREF and CMUL, using software, whereas in other embodiments, the operations described above in reference to BREF and CMUL may be implemented using some combination of hardware logic and software. To illustrate at least one example of how BREF and CMUL may be implemented for the case of a 32 bit data slice operand, the following is a discussion of how BREF and CMUL may be implemented in a specific hardware configuration, according to one embodiment of the invention. Other hardware configurations may be used to implement BREF and CMUL in other embodiments.

The instruction BREF reflects the bits of a given register or other storage structure, and in one embodiment, can be implemented by appropriately "wiring" each storage structure entry to a corresponding reflected entry. In one embodiment, the reflection may occur within a single processor clock cycle. The instruction CMUL, in one embodiment, performs carry-less (i.e., "polynomial") multiplication between the source operand and 32 bit register (e.g., "EAX") or a 64 bit register (e.g., "RAX"). The result is a 64-bit or 128-bit number where the 32 (or 64) most significant bits are stored in a 32 bit register, such as "EDX" (or 64 bit register, such as "RDX") and the 32 (or 64) least significant bits are stored in the register EAX (or RAX).

The logic functions, which describe the relationship between the bits of the inputs A and B and the outputs C and D, can be derived from the specification of the carry-less multiplication operation.

The following describes a particular hardware implementation of a 32 bit carry-less multiplier, according to one embodiment:

In one embodiment, register EAX stores an initial number, A, corresponding to 32 bit data slice:

$A = [a_{31} \, a_{30} \ldots a_0]$

Assume a source operand containing a generator:

$B = [b_{31} \, b_{30} \ldots b_0]$

The result from the a multiplication operation can be represented by:

$[D{:}C] = [d_{31} \, d_{30} \ldots d_0{:}c_{31} \, c_{30} \ldots c_0]$

Bit, $a_0$, is the least significant bit of A. Similarly, $b_0$ is the least significant bit of B, $c_0$ is the least significant bit of C and $d_0$ is the least significant bit of D. In one embodiment, the number D is found in the register EDX after the multiplication is complete, whereas the number C is found in the register EAX after the multiplication is complete.

$c_0 = a_0 b_0$ $c_1 = a_0 b_1 \oplus a_1 b_0$

...

$c_{31} = a_0 b_{31} \oplus a_1 b_{30} \oplus \ldots \oplus a_{31} b_0$ and:

$d_{31} = 0$ $d_{30} = a_{31} b_{31}$

...

$d_0 = a_{31} b_1 \oplus a_{30} b_2 \oplus \ldots \oplus a_1 b_{31}$

Equations for d[31:0] and c[31:0] can also be written as:

$$c_i = \bigoplus_{j=0}^{i} a_j b_{i-j}$$

and:

$$d_i = \bigoplus_{j=i+1}^{31} a_j b_{32+i-j}$$

The following describes an embodiment of the invention in which a 64 bit carry-less multiplication is performed:

In one embodiment register, RAX, stores an initial number, A, corresponding to 64 bit data slice:

$A = [a_{63} \, a_{62} \ldots a_0]$

Assume a source operand containing a generator:

$B = [b_{63} \, b_{62} \ldots b_0]$

The result from the a multiplication operation can be represented by:

$[D{:}C] = [d_{63} \, d_{62} \ldots d_0{:}c_{63} \, c_{62} \ldots c_0]$

Bit, $a_0$, is the least significant bit of A. Similarly, $b_0$ is the least significant bit of B, $c_0$ is the least significant bit of C and $d_0$ is the least significant bit of D. In one embodiment the number D is found in the register RDX after the multiplication is complete, whereas the number C is found in the register RAX after the multiplication is complete.

$c_0 = a_0 b_0$ $c_1 = a_0 b_1 \oplus a_1 b_0$

...

$c_{63} = a_0 b_{63} \oplus a_1 b_{62} \oplus \ldots \oplus a_{63} b_0$ and:

$d_{63} = 0$ $d_{62} = a_{63} b_{63}$

...

$d_0 = a_{63} b_1 \oplus a_{62} b_2 \oplus \ldots \oplus a_1 b_{63}$

Equations for d[63:0] and c[63:0] can also be written as:

$$c_i = \bigoplus_{j=0}^{i} a_j b_{i-j}$$

and:

$$d_i = \bigoplus_{j=i+1}^{63} a_j b_{64+i-j}$$

One can see that each of the logic functions of the above equations for $c_i$ and $d_i$ can be implemented in hardware, such as complementary metal-oxide-semiconductor (CMOS) logic, using XOR trees. The "deepest" XOR tree (the one containing the highest number of XOR operations), in the 32 bit example, is the one implementing the function $C_{31}$ which takes 32 inputs. The total number of XOR gates that may be used for implementing all the XOR trees of CMUL, in the 32 bit example, according to one embodiment, is then equal to 1+2+ ... +30+31+30+29+ ... +1=961 and the of AND gates that may be used in such an embodiment is 1+2+ ... +32+ 31+ ... +1=1024. Hence the total number of gates that may be used for implementing CMUL according to one embodiment is 1985.

In the 64 bit example, the total number of XOR gates that may be used to implement all XOR trees of a CMUL instruction, according to one embodiment, is equal to 1+ 2+ ... +62+63+62+61+ ... +1=3969. Furthermore, the total number of AND gates that may be used in such an embodiment is 1+2+ ... +64+63+ ... +1=4096. Hence the total number of gates that may be used to implement a CMUL instruction, according to one embodiment, is 8065.

As previously stated, one or more of the equations illustrated above may be implemented in software. "Software" may include one or more machine-readable instructions, which if executed by a machine cause the machine to perform operations to carry out at least one embodiment of the invention.

Figure 4:
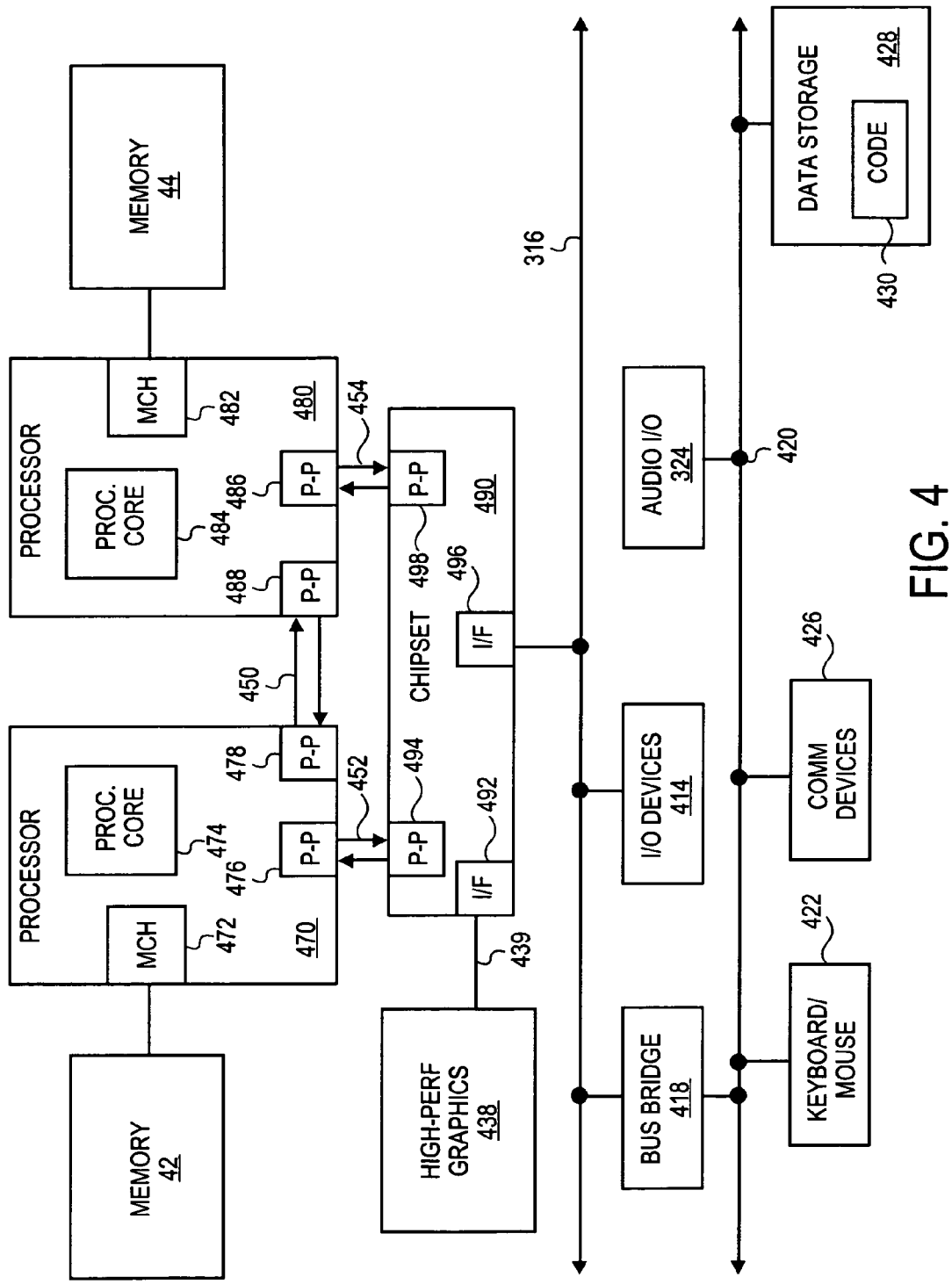
FIG. 4 illustrates a point-to-point (PtP) computer system in which one embodiment may be used.

FIG. 4 illustrates a point-to-point (PtP) computer system in which one embodiment may be used. In particular, FIG. 4 shows a system where processors, memory, and input/output devices are interconnected by a number of point-to-point interfaces.

The system of FIG. 4 may also include several processors, of which only two, processors 470, 480 are shown for clarity. Processors 470, 480 may each include a local memory controller hub (MCH) 472, 482 to connect with memory 22, 24. Processors 470, 480 may exchange data via a point-to-point (PtP) interface 450 using PtP interface circuits 478, 488. Processors 470, 480 may each exchange data with a chipset 490 via individual PtP interfaces 452, 454 using point to point interface circuits 476, 494, 486, 498. Chipset 490 may also exchange data with a high-performance graphics circuit 438 via a high-performance graphics interface 439.

At least one embodiment of the invention may be located within processing cores within each of the PtP bus agents of FIG. 4. Other embodiments of the invention, however, may exist in other circuits, logic units, or devices within the system of FIG. 4. Furthermore, other embodiments of the invention may be distributed throughout several circuits, logic units, or devices illustrated in FIG. 4.

Figure 5:
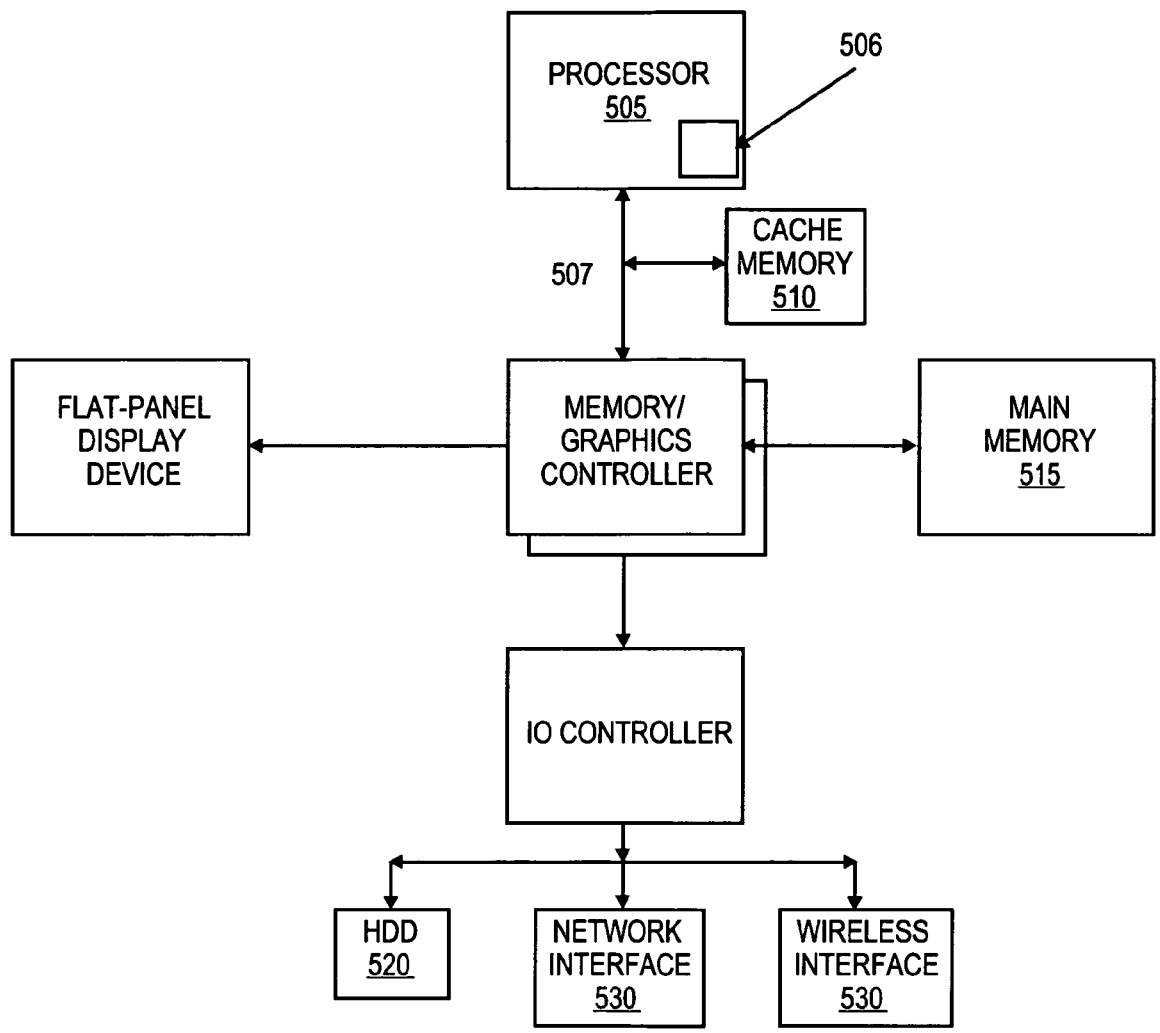
FIG. 5 illustrates a front-side-bus (FSB) computer system in which one embodiment of the invention may be used.

FIG. 5 illustrates a front-side-bus (FSB) computer system in which one embodiment of the invention may be used. A processor 505 accesses data from a level one (L1) cache memory 510 and main memory 515. In other embodiments of the invention, the cache memory may be a level two (L2) cache or other memory within a computer system memory hierarchy. Furthermore, in some embodiments, the computer system of FIG. 5 may contain both a L1 cache and an L2 cache, which comprise an inclusive cache hierarchy in which coherency data is shared between the L1 and L2 caches. In other embodiments there may be more than 1 cache hierarchy.

Illustrated within the processor of FIG. 5 is one embodiment of the invention 506. Other embodiments of the invention, however, may be implemented within other devices within the system, such as the graphics controller, or distributed throughout the system in hardware, software, or some combination thereof.

The main memory may be implemented in various memory sources, such as dynamic random-access memory (DRAM), a hard disk drive (HDD) 520, or a memory source located remotely from the computer system via network interface 530 containing various storage devices and technologies. The cache memory may be located either within the processor or in close proximity to the processor, such as on the processor's local bus 507. Furthermore, the cache memory may contain relatively fast memory cells, such as a six-transistor (6T) cell, or other memory cell of approximately equal or faster access speed.

The computer system of FIG. 5 may be a point-to-point (PtP) network of bus agents, such as microprocessors, that communicate via bus signals dedicated to each agent on the PtP network. Within, or at least associated with, each bus agent is at least one embodiment of invention 506, such that store operations can be facilitated in an expeditious manner between the bus agents.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

The invention claimed is:

1. A method comprising:
performing a first carry-less multiplication operation on a first binary operand having a first number of bits and a second binary operand having a second number of bits;
storing a most significant number of bits of a result of the first carry-less multiplication operation in a storage device, the most significant number of bits being equal to the first number of bits;
performing a second carry-less multiplication operation on the most significant number of bits of the result and all bits of a cyclic redundancy code (CRC) generator polynomial except the most significant bit of the CRC generator polynomial; and
generating a cyclic redundancy code (CRC) value based on the first and second carry-less multiplication operations.

2. The method of claim 1 further comprising performing a bit reflection operation on the first binary operand.

3. The method of claim 1 wherein the second binary operand is a modulo-2 arithmetic reciprocal value of a polynomial generator.

4. The method of claim 1 further comprising storing a least significant number of bits of the result of the second carry-less multiplication operation, the least significant number of bits being equal to one less than the number of bits of the CRC generator polynomial.

5. The method of claim 4, wherein the first binary operand is the result of a Boolean exclusive OR (XOR) operation between a first cyclic redundancy code (CRC) and a first portion of a data slice, and wherein the result of the second carry-less multiplication comprises a second CRC.

6. The method of claim 5 further comprising performing an XOR operation between the second CRC and an output value to generate a third CRC to be transmitted with the first portion of the data slice from a transmitter to a receiver.

7. The method of claim 6 wherein a bit reflection operation is performed before the carry-less multiply operation.

8. A machine-readable medium having stored thereon a set of instructions, which if executed by a machine cause the machine to perform a method comprising:
performing a first carry-less multiplication operation on a first binary operand having a first number of bits and a second binary operand having a second number of bits;
storing a most significant number of bits of a result of the first carry-less multiplication operation in a storage device, the most significant number of bits being equal to the first number of bits;
performing a second carry-less multiplication operation between the most significant number of bits of the result and all bits of a third binary operand except the most significant bit of the third binary operand; and generating a cyclic redundancy code (CRC) value based on the first and second carry-less multiplication operations.

9. The machine-readable medium of claim 8 wherein the method further comprises performing a bit reflection operation on the first binary operand.

10. The machine-readable medium of claim 9 wherein the bit reflection operation is to be performed by executing only a single instruction.

11. The machine-readable medium of claim 9 wherein the second binary operand is a modulo-2 arithmetic reciprocal value of a polynomial generator.

12. The machine-readable medium of claim 8 wherein the method further comprises storing a least significant number of bits of the result of the second carry-less multiplication operation, the least significant number of bits being equal to one less than the number of bits of the third binary operand.

13. The machine-readable medium of claim 12, wherein the first carry-less multiplication operation is to be performed by executing only a single instruction.

14. The machine-readable medium of claim 8 wherein the second carry-less multiplication operation is to be performed by executing only a single instruction.

15. An apparatus comprising:
a first hardware logic to perform a first carry-less multiplication operation on a first binary operand having a first number of bits and a second binary operand having a second number of bits;
a first storage unit comprising a storage device to store a most significant number of bits of a result of the first carry-less multiplication operation, the most significant number of bits being equal to the first number of bits; and
a second hardware logic to perform a second carry-less multiplication operation between the most significant number of bits of the result and all bits of a third binary operand except the most significant bit of the third binary operand,
wherein a cyclic redundancy code (CRC) value is to be generated based on the first and second carry-less multiplication operations.

16. The apparatus of claim 15 further comprising a third logic to perform a bit reflection operation on the first binary operand.

17. The apparatus of claim 15 wherein the second binary operand is a modulo-2 arithmetic reciprocal value of a polynomial generator.

18. The apparatus of claim 15 further comprising a second storage unit to store a least significant number of bits of the result of the second carry-less multiplication operation, the least significant number of bits being equal to one less than the number of bits of the third binary operand.

19. The apparatus of claim 18, wherein the first binary operand is the result of a Boolean exclusive OR (XOR) operation between a first cyclic redundancy code (CRC) and a first portion of a data slice, and wherein the result of the second carry-less multiplication comprises a second CRC.

20. The apparatus of claim 19 further comprising an XOR device to perform an XOR operation between the second CRC and an output value to generate a third CRC to be transmitted with the first portion of the data slice from a transmitter to a receiver.

21. The apparatus of claim 20 further comprising a transmitter to transmit the third cyclic redundancy code and the first portion of the data slice.

22. The apparatus of claim 20 further comprising a receiver to receive the third cyclic redundancy code and the first portion of the data slice.

23. A system comprising:
a processor to execute an instruction to perform a first carry-less multiplication operation on a first binary operand having a first number of bits and a second binary operand having a second number of bits;
a memory to store a most significant number of bits of a result of the first carry-less multiplication operation, the most significant number of bits being equal to the first number of bits,
wherein the processor is to perform a second carry-less multiplication operation on the most significant number of bits of the result and all bits of a third binary operand except the most significant bit of the third binary operand, wherein a cyclic redundancy code (CRC) value is to be generated based on the first and second carry-less multiplication operations.

24. The system of claim 23 wherein the processor is contained within a transmitting apparatus.

25. The system of claim 23 wherein the processor is contained within a receiving apparatus.

26. The system of claim 23 wherein the memory is to store a least significant number of bits of the result of the second carry-less multiplication operation, the least significant number of bits being equal to one less than the number of bits of the third operand.

* * * * *